United States Patent
Hernando et al.

(10) Patent No.: US 10,712,412 B2
(45) Date of Patent: Jul. 14, 2020

(54) SYSTEM AND METHOD FOR STIMULATED ECHO BASED MAPPING (STEM) USING MAGNETIC RESONANCE IMAGING (MRI)

(71) Applicant: Wisconsin Alumni Research Foundation, Madison, WI (US)

(72) Inventors: Diego Hernando, Madison, WI (US); Yuxin Zhang, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 106 days.

(21) Appl. No.: 15/960,235

(22) Filed: Apr. 23, 2018

(65) Prior Publication Data
US 2019/0324102 A1 Oct. 24, 2019

(51) Int. Cl.
G01R 33/44 (2006.01)
G01R 33/56 (2006.01)
G01R 33/563 (2006.01)
G01R 33/561 (2006.01)

(52) U.S. Cl.
CPC ....... *G01R 33/443* (2013.01); *G01R 33/5602* (2013.01); *G01R 33/5608* (2013.01); *G01R 33/5615* (2013.01); *G01R 33/56341* (2013.01)

(58) Field of Classification Search
CPC combination set(s) only.
See application file for complete search history.

(56) References Cited

U.S. PATENT DOCUMENTS

| | | | | |
|---|---|---|---|---|
| 7,015,696 | B2 * | 3/2006 | Kabasawa | G01R 33/341 324/309 |
| 9,687,172 | B2 * | 6/2017 | Bhat | A61B 5/055 |
| 2005/0134266 | A1 * | 6/2005 | Kabasawa | G01R 33/341 324/309 |
| 2012/0194189 | A1 * | 8/2012 | Sun | G01R 33/50 324/309 |
| 2014/0309520 | A1 * | 10/2014 | Lee | G01R 33/56366 600/419 |

(Continued)

OTHER PUBLICATIONS

Nan-kuei C, et al., A robust multi-shot scan strategy for high-resolution diffusion weighted MRI enabled by multiplexed sensitivity-encoding (MUSE). NeuroImage 2013;72:41-47.

(Continued)

*Primary Examiner* — Dixomara Vargas
(74) *Attorney, Agent, or Firm* — Quarles & Brady LLP

(57) ABSTRACT

A system and method are provided for acquiring a plurality of differently-weighted images of a subject using a single pulse sequence. The method includes determining imaging parameters for a pulse sequence that includes a diffusion weighted module and an anatomical imaging module. The imaging parameters include at least a repetition time (TR), a mixing time (TM), an echo time (TE), and a diffusion weighting b-value, with at least two different values of at least TM, TE, and diffusion weighting b-value. The method also includes performing a pulse sequence using the imaging parameters to acquire MR image data from a subject. The different values of at least TM, TE, and diffusing weighting b-value are used to acquire the MR image data. Furthermore, the method includes reconstructing, from the MR image data, a plurality of images of the subject, including at least a T1-weighted image, a T2-weighted image, and a diffusion-weighted image.

19 Claims, 6 Drawing Sheets

(56) References Cited

U.S. PATENT DOCUMENTS

| | | | |
|---|---|---|---|
| 2015/0038827 A1* | 2/2015 | Yamagata | A61B 5/055 600/411 |
| 2015/0108976 A1* | 4/2015 | Fischer | G01R 33/5616 324/309 |
| 2015/0234027 A1* | 8/2015 | Stemmer | G01R 33/56383 324/309 |
| 2015/0301142 A1* | 10/2015 | Griswold | G01R 33/4828 324/309 |
| 2015/0363951 A1* | 12/2015 | Wedeen | A61B 5/055 345/419 |
| 2016/0025835 A1* | 1/2016 | Gulani | G01R 33/5635 600/420 |
| 2016/0131727 A1* | 5/2016 | Sacolick | G01R 33/445 324/318 |
| 2016/0202338 A1* | 7/2016 | Kimura | G01R 33/5608 324/309 |
| 2016/0341808 A1* | 11/2016 | Zhang | G01R 33/483 |
| 2017/0007148 A1* | 1/2017 | Kaditz | A61B 5/055 |
| 2017/0038449 A1* | 2/2017 | Voigt | G01R 33/4838 |
| 2017/0061620 A1* | 3/2017 | Park | G06T 5/001 |
| 2017/0139023 A1* | 5/2017 | Kusahara | G01R 33/283 |
| 2017/0178319 A1* | 6/2017 | Sugiura | G06F 3/04847 |
| 2019/0223789 A1* | 7/2019 | Wang | A61B 5/004 |
| 2019/0265322 A1* | 8/2019 | Griswold | G01R 33/56341 |

OTHER PUBLICATIONS

Jiang, Yun, et al. "Simultaneous T1, T2, diffusion and proton density quantification with MR fingerprinting." (2014): 28.
Yu, Alice C., et al. "Development of a combined MR fingerprinting and diffusion examination for prostate cancer" Radiology 283.3 (2017): 729-738.
Zhang Y. et al., "Stimulated echo based mapping (STEM) of T1, T2, and apparent diffusion coefficient: validation and protocol optimization." Magnetic resonance in medicine 81.1 (2019): 167-181.
Neema M, et al., T1-and T2-Based MRI Measures of Diffuse Gray Matter and White Matter Damage in Patients with Multiple Sclerosis. J Neuroimaging, 2007;17(s):16s-21s.
Vymazal J, et al., T1 and T2 in the brain of healthy subjects, patients with Parkinson disease, and patients with multiple system atrophy: relation to iron content. Radiology, 1999;211(2):489-495.
Bohnen S. et al., Performance of T1 and T2 mapping cardiovascular magnetic resonance to detect active myocarditis in patients with recent-onset heart failure. Circ Cardiovascular Imaging, 2015;8(6): e003070.
Blume U, et al., Interleaved T1 and T2 relaxation time mapping for cardiac applications. J Magn Reson Imag 2009;29 (2):480-487.
Kershaw LE, et al., Benign prostatic hyperplasia: Evaluation of T1, T2, and microvascular characteristics with T1-weighted dynamic contrast-enhanced MRI. J Magn Reson Imag 2009;29(3):641-648.
Foltz WD, et al., (2013). Changes in apparent diffusion coefficient and T2 relaxation during radiotherapy for prostate cancer J Magn Reson Imag 2013;37(4):909-916.
Gibbs P, et al., Comparison of quantitative T2 mapping and diffusion-weighted imaging in the normal and pathologic prostate. Magn Reson Med 2001;46(6):1054-1058.
Langer DL, et al., Prostate cancer detection with multi-parametric MRI: Logistic regression analysis of quantitative T2, diffusion-weighted imaging, and dynamic contrast-enhanced MRI. J Magn Reson Imag 2009; 30(2):327-334.
Yankeelov TE, et al., Integration of quantitative DCE-MRI and ADC mapping to monitor treatment response in human breast cancer: initial results. Magn Reson Imag2007;25(1):1-13.
Li K, et al., Multi-parametric MRI characterization of healthy human thigh muscles at 3.0T-relaxation, magnetization transfer, fat/water, and diffusion tensor imaging. NMR Biomed 2014;27(9):1070-1084.
Saab G, et al., Multicomponent T2 relaxation of in-vivo skeletal muscle. Magn Reson Med 1999;42(1):150-157.

Morvan D, et al., Simultaneous measurements of diffusion and transverse relaxation in exercising skeletal muscle. Magn Reson Imag 1995;13(7):943-948.
Tuch DS. Q-ball imaging. Magn Reson Med 2004;52(6):1358-1372.
Yeh FC, et al., Mapping immune cell infiltration using restricted diffusion MRI. Magn Reson Med 2017;77(2):603-612.
Lu H, et al., Three-dimensional characterization of non-Gaussian water diffusion in humans using diffusion kurtosis imaging. NMR Biomed 2006;19(2)236-247.
Barral JK, et al., A robust methodology for in vivo T1 mapping. Magn Reson Med 2010;64(4):1057-1067.
Deoni SC, et al., High-resolution T1 and T2 mapping of the brain in a clinically acceptable time with DESPOT1 and DESPOT2. Magn Reson Med 2005; 53(1):237-241.
Deoni SC, et al., Rapid combined T1 and T2 mapping using gradient recalled acquisition in the steady state. Magn Reson Med 2003;49(3):515-526.
Shi X, et al., Single-shot T1 mapping using simultaneous acquisitions of spin-and stimulated-echo-planar imaging (2D ss-SESTEPI). Magn Reson Med 2010; 64(3):734-742.
Bammer R. Basic principles of diffusion-weighted imaging. Eur J Radiol 2003;45(3):169-184.
Gras V, et al., Diffusion-weighted DESS protocol optimization for simultaneous mapping of the mean diffusivity, proton density and relaxation times at 3 Tesla. Magn Reson Med 2017;78(1):130-141.
Ma D, et al., Slice profile and B1 corrections in 2D magnetic resonance fingerprinting. Magn Reson Med 2017; 78 (5):1781-1789.
Moonen CT, et al., Comparison of single-shot localization methods (Steam and Press) for In vivo proton NMR spectroscopy. NMR Biomed1989;2(5-6):201-208.
Ruschke S, et al., Diffusion-weighted stimulated echo acquisition mode (DW-STEAM) MR spectroscopy to measure fat unsaturation in regions with low proton-density fat fraction. Magn Reson Med 2016;75(1): 32-41.
Hamilton G, et al., In vivo breath-hold 1H MRS simultaneous estimation of liver proton density fat fraction, and T1 and T2 of water and fat, with a multi-TR, multi-TE sequence. J Magn Reson Imag2015;42(6):1538-1543.
Teruel JR, et al., Stimulated echo diffusion tensor imaging (STEAM-DTI) with varying diffusion times as a probe of breast tissue. J Magn Reson Imag 2017;45(1): 84-93.
Zhang H, et al., Stimulated echo diffusion weighted imaging of the liver at 3 Tesla. Magn Reson Med 2017; 77(1): 300-309.
Merboldt KD, et al., Diffusion imaging using stimulated echoes. Magnetic Resonance in Medicine, 1991;19(2):233-239.
Kim D, et al , Diffusion-relaxation correlation spectroscopic imaging: A multidimensional approach for probing microstructure. Magn Reson Med2017. https://doi.org/10.1002/mrm.26629.
Mulkem RV, et al., Multi-component apparent diffusion coefficients in human brain: relationship to spin-lattice relaxation. Magn Reson Med 2000; 44(2):292-300.
Le Bihan D, et al., Separation of diffusion and perfusion in intravoxel incoherent motion MR imaging. Radiology 1988;168(2):497-505.
Wang X, et al., An acetone-based phantom for quantitative diffusion MRI. J Magn Reson Imag 2017. https://doi.org/10.1002/jmri.25727.
Panagiotaki E, et al., Compartment models of the diffusion MR signal in brain white matter: a taxonomy and comparison. NeuroImage 2012; 59:2241-2254.
Helenius J, et al., Diffusion-weighted MR imaging in normal human brains in various age groups. Am J Radiol 2002;23 (2):194-199.
Panagiotaki E, et al., Microstructural characterization of normal and malignant human prostate tissue with vasvular, extracellular and restricted diffusion for cytometry in tumours magnetic resonance imaging. Invest Radio 2015; 50 (4):218-227.
Hall MG, et al., Assessment of non-Gaussian diffusion with singly and doubly stretched biexponential models of diffusion-weighted MRI (DWI) signal attenuation in prostate tissue. NMR Biomed 2015; 28: 486-495.
Lemberskiy G, et al., Time-dependent diffusion in prostate cancer. Invest Radio 2017; 52: 405-411.

(56) References Cited

OTHER PUBLICATIONS

Karlsen OT, et al., Parameter estimation from Rician-distributed data sets using a maximum likelihood estimator: application to T1 and perfusion measurements. Magn Reson Med 1999;41:614-623.
Sacolick LI, et al., B1 mapping by Bloch-Siegert shift. Magn Reson Med 2010;63(5):1315-1322.
Kumar R, et al., Age-related regional brain T2-relaxation changes in healthy adults. J Magn Reson Imag 2012;35 (2):300-308.
Clark CA, et al., Diffusion time dependence of the apparent diffusion tensor in healthy human brain and white matter disease. Magn Reson Med 2001;45(6):1126-1129.
De Bazelaire CM, et al., MR imaging relaxation times of abdominal and pelvic tissues measured in vivo at 3.0 T: preliminary results. Radiology 2004; 230(3):652-659.
Medved M, et al., MR imaging of the prostate and adjacent anatomic structures before, during, and after ejaculation: qualitative and quantitative evaluation. Radiology2014; 271:452-460.
Gibbs P, et al., Diffusion imaging of the prostate at 3.0 Tesla. Invest Radiol2006; 41:185-188.
Tamada T, et al., Age-related and zonal anatomical changes of apparent diffusion coefficient values in normal human prostatic tissues. J Magn Reson Med 2008; 27:552-556.
Benjamini D, et al., Use of marginal distributions constrained optimization (MADCO) for accelerated 2D MRI relaxometry and diffusometry. J Magn Reson 2016;271: 40-45.
Korn N, et al., Reduced-FOV excitation decreases susceptibility artifact in diffusion-weighted MRI with endorectal coil for prostate cancer detection. Magn Reson Imag 2015;33(1):56-62.

\* cited by examiner

SYSTEM AND METHOD FOR STIMULATED ECHO BASED MAPPING (STEM) USING MAGNETIC RESONANCE IMAGING (MRI)

STATEMENT REGARDING FEDERALLY SPONSORED RESEARCH

This invention was made with government support under DK100022 awarded by the National Institutes of Health. The government has certain rights in the invention.

BACKGROUND

The field of the invention is systems and methods for magnetic resonance imaging ("MRI"). More particularly, the invention relates to systems and methods for using stimulated echo based mapping (STEM) imaging using magnetic resonance.

Quantitative multi-parametric MRI may enable improved diagnosis and treatment monitoring in various applications. Mapping of relaxation and diffusion parameters may enable advanced characterization of healthy and diseased tissue, with emerging clinical and research applications. Indeed, quantitative mapping of T1, T2, and apparent diffusion coefficient (ADC) has multiple previously proposed and potential applications, including in brain, cardiac, breast, and prostate imaging. Further, quantitative MRI methods may facilitate comparison of data longitudinally or between centers, as required for effective longitudinal treatment monitoring and multi-center clinical trials.

Mapping of relaxation and diffusion parameters is typically performed using multiple separate acquisitions, including one or several relaxometry pulse sequences and a separate diffusion-weighted imaging (DWI) pulse sequence. However, the need for multiple separate acquisitions using multiple pulse sequences is often not practical for clinical applications, due to long acquisition times and the challenges of obtaining co-registered parametric maps. Therefore, simultaneous mapping of relaxation (e.g., T1 and T2) and diffusion (e.g., ADC) parameters based on a single acquisition sequence is highly desirable in order to provide rapid and co-registered quantitative multi-parametric MRI.

Previous studies have explored simultaneous T1, T2 and ADC mapping with methods including diffusion-weighted Dual-Echo Steady State (DESS) and MR Fingerprinting (MRF). However, these previously-proposed techniques face substantial limitations. For the DESS method, the signal from steady-state sequence is complicated to model, especially with diffusion encoding, which may result in inaccuracy and large variance in diffusion measurements. Also, though preliminary results have shown promise for MRF with simultaneous ADC mapping, probing diffusion within the MRF framework can be challenging and may be subject to multiple confounding factors.

Stimulated-echo (STE) based simultaneous T1, T2 and ADC mapping is a promising approach to overcome the limitations of previous techniques. The STE diffusion weighted imaging (DWI) pulse sequence enables the modulation of T1, T2 and diffusion weighting by varying the mixing time (TM), echo time (TE) and b-values, respectively. As a result, by acquiring multiple (at least four) STE images with varying TM, TE, and b-values, simultaneous co-registered mapping of T1, T2 and ADC is possible. STE has been used for MR spectroscopy-based relaxometry and DWI. However, the lack of a reliable and efficient simultaneous T1 and T2 and ADC mapping technique continues to be an important unmet need.

Thus, it would be desirable to have a system and method for rapid and co-registered mapping of T1, T2 and ADC that overcomes the problems facing those attempts described above.

SUMMARY

The present disclosure overcomes the aforementioned drawbacks by providing systems and methods for creating a plurality of differently-weighted images of a subject using a single pulse sequence, referred to herein as stimulated-echo based mapping (STEM) pulse sequence. The STEM pulse sequence provides a framework that enables one to probe dynamic changes of contrast mechanisms, including T1, T2, and diffusion, over time or via other imaging variables or imaging parameters of the STEM pulse sequence, without having to perform multiple or serial pulse sequences. In this way, imaging parameters can be selected in accordance with the present disclosure to utilize the STEM pulse sequence to acquire MR imaging data that can be used to create T1-, T2, and diffusion-weighted images. Since the multiple images are reconstructed from data acquired during a common or singular pulse sequence, the images are registered and highly flexible for a variety of clinical uses. Furthermore, imaging acquisition is efficient/reduced compared to traditional methods that require the use of multiple pulse sequences.

In accordance with one aspect of the disclosure, a magnetic resonance imaging (MRI) system is provided that includes a magnet system configured to generate a polarizing magnetic field about at least a portion of a subject arranged in the MRI system. The MRI system also includes a plurality of gradient coils configured to apply a gradient field to the polarizing magnetic field and a radio frequency (RF) system configured to apply an excitation field to the subject and acquire MR image data from the subject. The MRI system further includes a computer system programmed to generate a plurality of differently-weighted images of a subject by selecting imaging parameters for a pulse sequence that includes a diffusion weighted module and an anatomical imaging module. The imaging parameters include at least a repetition time (TR), a mixing time (TM), an echo time (TE), and a diffusion weighting b-value. The imaging parameters include at least two different values of at least TM, TE, and diffusing weighting b-value. The computer system is further programmed to generate the images by controlling the plurality of gradient coils and RF system to perform the pulse sequence using the imaging parameters to acquire the MR image data from the subject. The at least two different values of at least TM, TE, and diffusing weighting b-value are used to acquire the MR image data. The computer system is further programmed to generate the images by reconstructing, from the MR image data, a plurality of images of the subject, including at least a T1-weighted image, a T2-weighted image, and a diffusion-weighted image. The MRI system also includes a display configured to display the T1-weighted image, the T2-weighted image, and the diffusion-weighted image.

In accordance with another aspect of the disclosure, a method is provided for acquiring a plurality of differently-weighted images of a subject using a single pulse sequence. The method includes determining imaging parameters for a pulse sequence that includes a diffusion weighted module and an anatomical imaging module. The imaging parameters include at least a repetition time (TR), a mixing time (TM), an echo time (TE), and a diffusion weighting b-value. The imaging parameters include at least two different values of at least TM, TE, and diffusing weighting b-value. The method also includes using a magnetic resonance imaging system, performing a pulse sequence using the imaging parameters to acquire MR image data from a subject. The at least two different values of at least TM, TE, and diffusing weighting b-value are used to acquire the MR image data. The method further includes reconstructing, from the MR image data, a plurality of images of the subject, including at least a T1-weighted image, a T2-weighted image, and a diffusion-weighted image.

The foregoing and other aspects and advantages of the invention will appear from the following description. In the description, reference is made to the accompanying drawings, which form a part hereof, and in which there is shown by way of illustration a preferred embodiment of the invention. Such embodiment does not necessarily represent the full scope of the invention, however, and reference is made therefore to the claims and herein for interpreting the scope of the invention.

DETAILED DESCRIPTION

Figure 1:
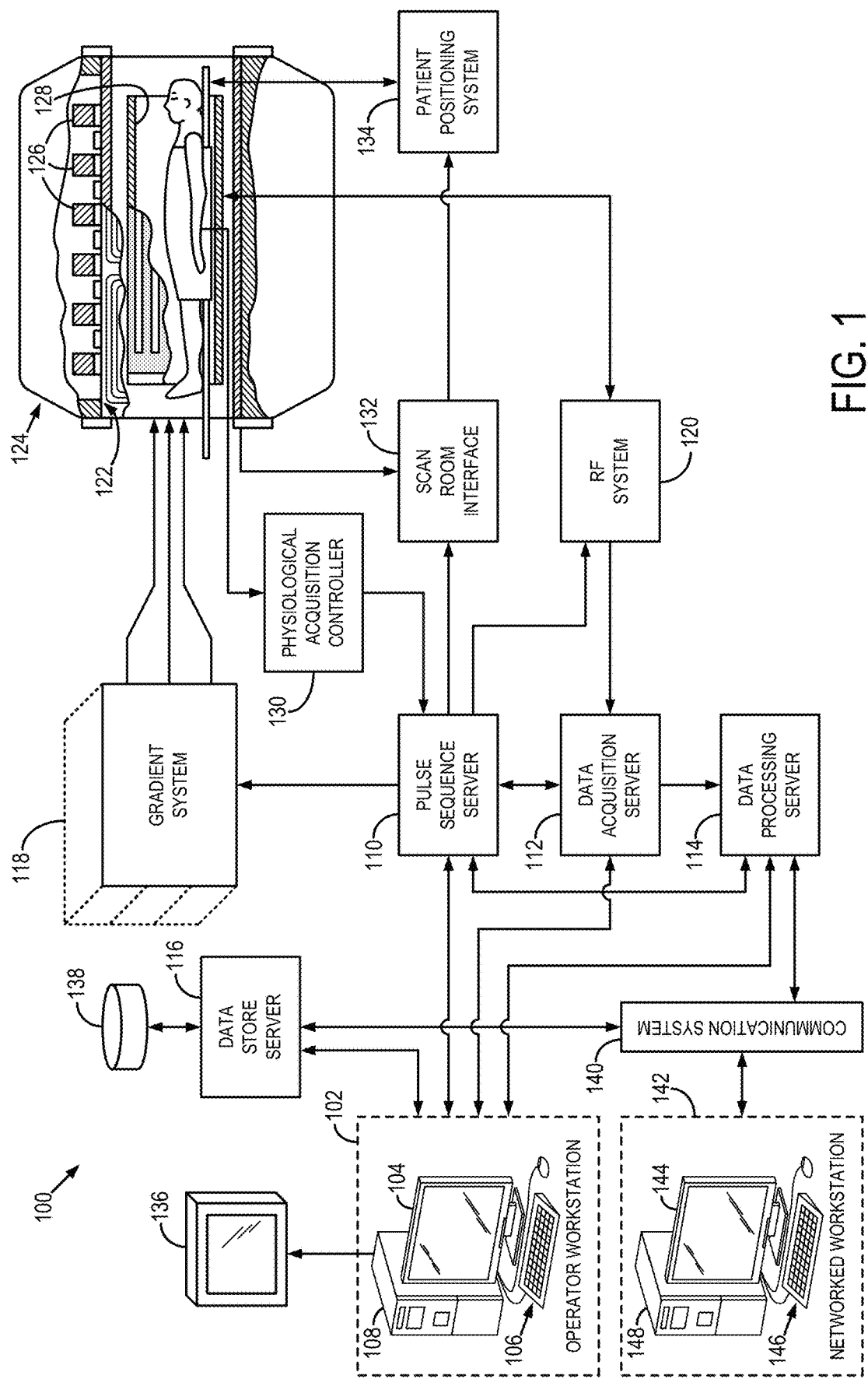
FIG. 1 is a block diagram of an exemplary magnetic resonance imaging ("MRI") system configured in accordance with the present disclosure.

Referring now to FIG. 1, these confounder-corrected approaches may be implemented using or designed to accompany a magnetic resonance imaging ("MRI") system 100, such as is illustrated in FIG. 1. The MRI system 100 includes an operator workstation 102, which will typically include a display 104, one or more input devices 106 (such as a keyboard and mouse or the like), and a processor 108. The processor 108 may include a commercially available programmable machine running a commercially available operating system. The operator workstation 102 provides the operator interface that enables scan prescriptions to be entered into the MRI system 100. In general, the operator workstation 102 may be coupled to multiple servers, including a pulse sequence server 110; a data acquisition server 112; a data processing server 114; and a data store server 116. The operator workstation 102 and each server 110, 112, 114, and 116 are connected to communicate with each other. For example, the servers 110, 112, 114, and 116 may be connected via a communication system 140, which may include any suitable network connection, whether wired, wireless, or a combination of both. As an example, the communication system 140 may include both proprietary or dedicated networks, as well as open networks, such as the internet.

The pulse sequence server 110 functions in response to instructions downloaded from the operator workstation 102 to operate a gradient system 118 and a radiofrequency ("RF") system 120. Gradient waveforms to perform the prescribed scan are produced and applied to the gradient system 118, which excites gradient coils in an assembly 122 to produce the magnetic field gradients $G_x$, $G_y$, $G_z$ used for position encoding magnetic resonance signals. The gradient coil assembly 122 forms part of a magnet assembly 124 that includes a polarizing magnet 126 and a whole-body RF coil 128.

RF waveforms are applied by the RF system 120 to the RF coil 128, or a separate local coil (not shown in FIG. 1), in order to perform the prescribed magnetic resonance pulse sequence. Responsive magnetic resonance signals detected by the RF coil 128, or a separate local coil, are received by the RF system 120, where they are amplified, demodulated, filtered, and digitized under direction of commands produced by the pulse sequence server 110. The RF system 120 includes an RF transmitter for producing a wide variety of RF pulses used in MRI pulse sequences. The RF transmitter is responsive to the scan prescription and direction from the pulse sequence server 110 to produce RF pulses of the desired frequency, phase, and pulse amplitude waveform. The generated RF pulses may be applied to the whole-body RF coil 128 or to one or more local coils or coil arrays.

The RF system 120 also includes one or more RF receiver channels. Each RF receiver channel includes an RF preamplifier that amplifies the magnetic resonance signal received by the coil 128 to which it is connected, and a detector that detects and digitizes the I and Q quadrature components of the received magnetic resonance signal. The magnitude of the received magnetic resonance signal may, therefore, be determined at any sampled point by the square root of the sum of the squares of the I and Q components:

$$M=\sqrt{I^2+Q^2} \qquad \text{Eqn. 1;}$$

and the phase of the received magnetic resonance signal may also be determined according to the following relationship:

$$\varphi = \tan^{-1}\left(\frac{Q}{I}\right). \qquad \text{Eqn. 2}$$

The pulse sequence server 110 also optionally receives patient data from a physiological acquisition controller 130. By way of example, the physiological acquisition controller 130 may receive signals from a number of different sensors connected to the patient, such as electrocardiograph ("ECG") signals from electrodes, or respiratory signals from a respiratory bellows or other respiratory monitoring device. Such signals are typically used by the pulse sequence server 110 to synchronize, or "gate," the performance of the scan with the subject's heart beat or respiration.

The pulse sequence server 110 also connects to a scan room interface circuit 132 that receives signals from various sensors associated with the condition of the patient and the magnet system. It is also through the scan room interface circuit 132 that a patient positioning system 134 receives commands to move the patient to desired positions during the scan.

The digitized magnetic resonance signal samples produced by the RF system 120 are received by the data acquisition server 112. The data acquisition server 112 operates in response to instructions downloaded from the operator workstation 102 to receive the real-time magnetic resonance data and provide buffer storage, such that no data is lost by data overrun. In some scans, the data acquisition server 112 does little more than pass the acquired magnetic resonance data to the data processor server 114. However, in scans that require information derived from acquired magnetic resonance data to control the further performance of the scan, the data acquisition server 112 is programmed to produce such information and convey it to the pulse sequence server 110. For example, during prescans, magnetic resonance data is acquired and used to calibrate the pulse sequence performed by the pulse sequence server 110. As another example, navigator signals may be acquired and used to adjust the operating parameters of the RF system 120 or the gradient system 118, or to control the view order in which k-space is sampled. In still another example, the data acquisition server 112 may also be employed to process magnetic resonance signals used to detect the arrival of a contrast agent in a magnetic resonance angiography ("MRA") scan. By way of example, the data acquisition server 112 acquires magnetic resonance data and processes it in real-time to produce information that is used to control the scan.

The data processing server 114 receives magnetic resonance data from the data acquisition server 112 and processes it in accordance with instructions downloaded from the operator workstation 102. Such processing may, for example, include one or more of the following: reconstructing two-dimensional or three-dimensional images by performing a Fourier transformation of raw k-space data; performing other image reconstruction techniques, such as iterative or backprojection reconstruction techniques; applying filters to raw k-space data or to reconstructed images; generating functional magnetic resonance images; calculating motion or flow images; and so on.

Images reconstructed by the data processing server 114 are conveyed back to the operator workstation 102. Images may be output to operator display 112 or a display 136 that is located near the magnet assembly 124 for use by attending clinician. Batch mode images or selected real time images are stored in a host database on disc storage 138. When such images have been reconstructed and transferred to storage, the data processing server 114 notifies the data store server 116 on the operator workstation 102. The operator workstation 102 may be used by an operator to archive the images, produce films, or send the images via a network to other facilities.

The MRI system 100 may also include one or more networked workstations 142. By way of example, a networked workstation 142 may include a display 144, one or more input devices 146 (such as a keyboard and mouse or the like), and a processor 148. The networked workstation 142 may be located within the same facility as the operator workstation 102, or in a different facility, such as a different healthcare institution or clinic. The networked workstation 142 may include a mobile device, including phones or tablets.

The networked workstation 142, whether within the same facility or in a different facility as the operator workstation 102, may gain remote access to the data processing server 114 or data store server 116 via the communication system 140. Accordingly, multiple networked workstations 142 may have access to the data processing server 114 and the data store server 116. In this manner, magnetic resonance data, reconstructed images, or other data may exchanged between the data processing server 114 or the data store server 116 and the networked workstations 142, such that the data or images may be remotely processed by a networked workstation 142. This data may be exchanged in any suitable format, such as in accordance with the transmission control protocol ("TCP"), the internet protocol ("IP"), or other known or suitable protocols.

The above-described system may be configured or otherwise used to carry out processes in accordance with the present disclosure. In particular, as will be described in further detail, one aspect for using the above-described or similar systems for carrying out processes in accordance with the present disclosure, such as will be described with respect to the non-limiting example in FIG. 2B, which includes performing a pulse sequence, such as illustrated in FIG. 2A using the an MRI system, such as illustrated in FIG. 1.

Figure 2A:
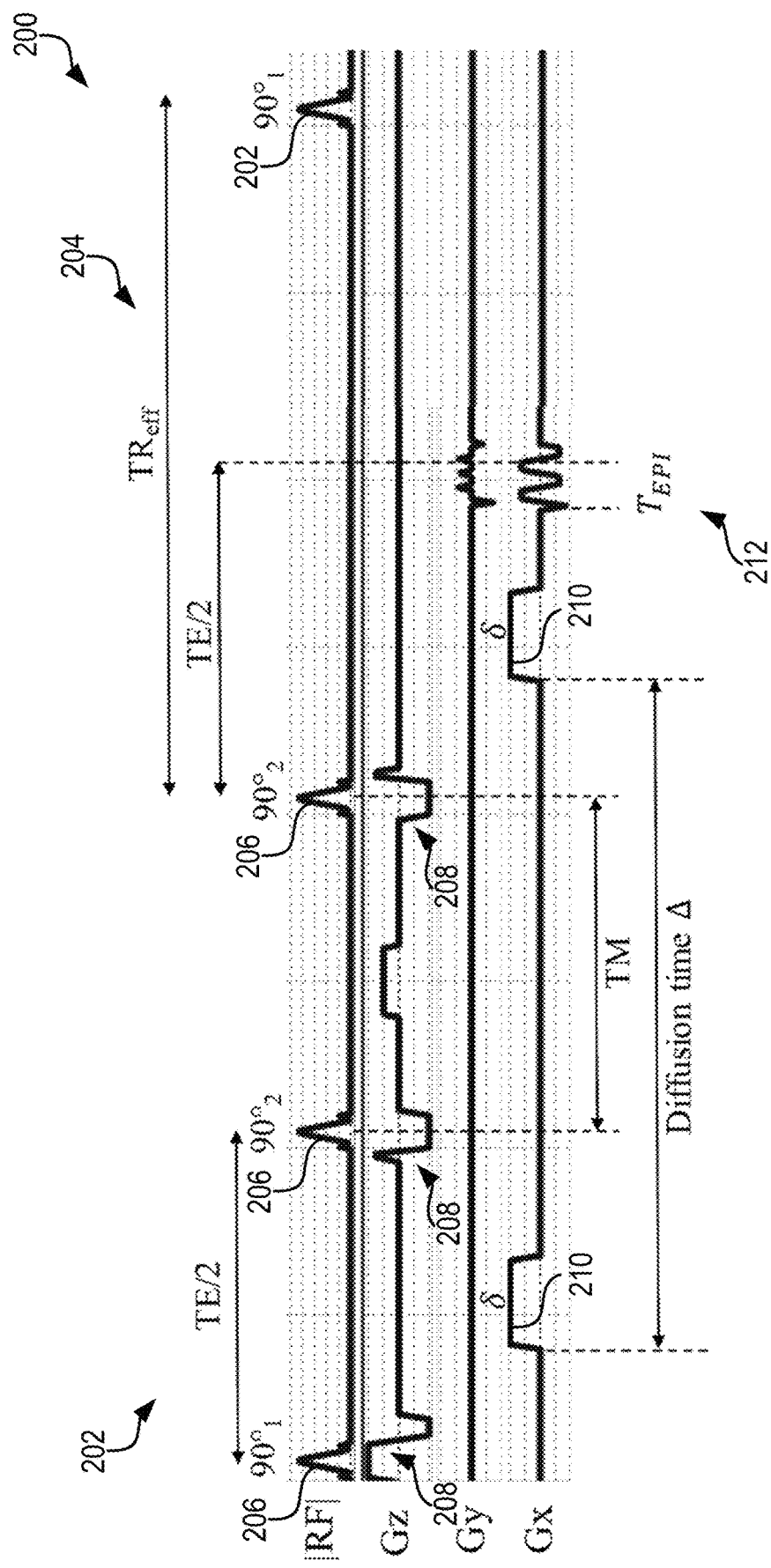
FIG. 2A is a graphic representation of an exemplary pulse sequence for directing the MRI system of FIG. 1 to acquire image data in accordance with the present disclosure.

Specifically, FIG. 2A provides a pulse sequence diagram for a stimulated-echo mapping (STEM) pulse sequence 200, in accordance with the present disclosure, which reflects a stimulated-echo (STE) diffusion weighted imaging (DWI) pulse sequence that is adapted with a further EPI sequence and has selectable imaging parameters that enable simultaneous acquisition of T1, T2, ADC, and even proton density weighted maps. That is, as illustrated, the STEM pulse sequence 200 can be conceptualized as including a diffusion weighted module 202 and an anatomical imaging module 204, which is illustrated as one non-limiting example as an echo planar imaging module. As will be described, the STEM pulse sequence 200 and systems and methods utilizing the STEM pulse sequence described herein can be used to create maps. The STEM pulse sequences 200 and systems and methods described herein can also be used to generate synthetic images with arbitrary T1-, T2-, and diffusion-weighting because, once quantitative maps have been attained, one can synthesize any arbitrary weighting. In this way, the term "images" as used herein refers to graphic displays of information and may include maps (e.g., T1 maps, T2 maps, ADC maps, etc.) and/or anatomical representations with a given weighting (T1-weighted images, T2-weighted images, diffusion-weighted images, etc.).

More particularly, the STEM pulse sequence 200 includes a plurality of radio frequency (RF) excitation pulses 206 separated by ½ echo time (TE/2) or by the mixing time (TM) and defining an effective repetition time ($TR_{eff}$). In the diffusion weighted module 202, the RF excitation pulses 206 are coupled with corresponding gradient pulses 208 along a given direction, in the non-limiting example illustrated in FIG. 2, the gradient pulses are along the z-direction. Additionally, as illustrated, diffusion gradients 210 are applied, in this non-limiting example, along the x-direction. In the EPI module 204, EPI gradients 212 may be applied.

The STEM pulse sequence 200 can be conceptualized as eliciting four exponential decays, including T1 dependence from repetition time (TR), T1-weighting from mixing time (TM), T2-weighting from TE, and diffusion-weighting from the applied magnetic fields given as a b-value. Any of a variety of signal models may be used. In one non-limiting example, the acquired STEM signal is modeled as:

$$S = A\left(1 - e^{-\frac{TR_{eff}}{T1}}\right) e^{\left(-\frac{TM}{T1}\right)} e^{\left(-\frac{TE}{T2}\right)} e^{(-bADC)}; \qquad \text{Eqn. 3}$$

where:

$$TR_{eff} = TR - TM - \frac{TE}{2}. \qquad \text{Eqn. 4}$$

Figure 2B:
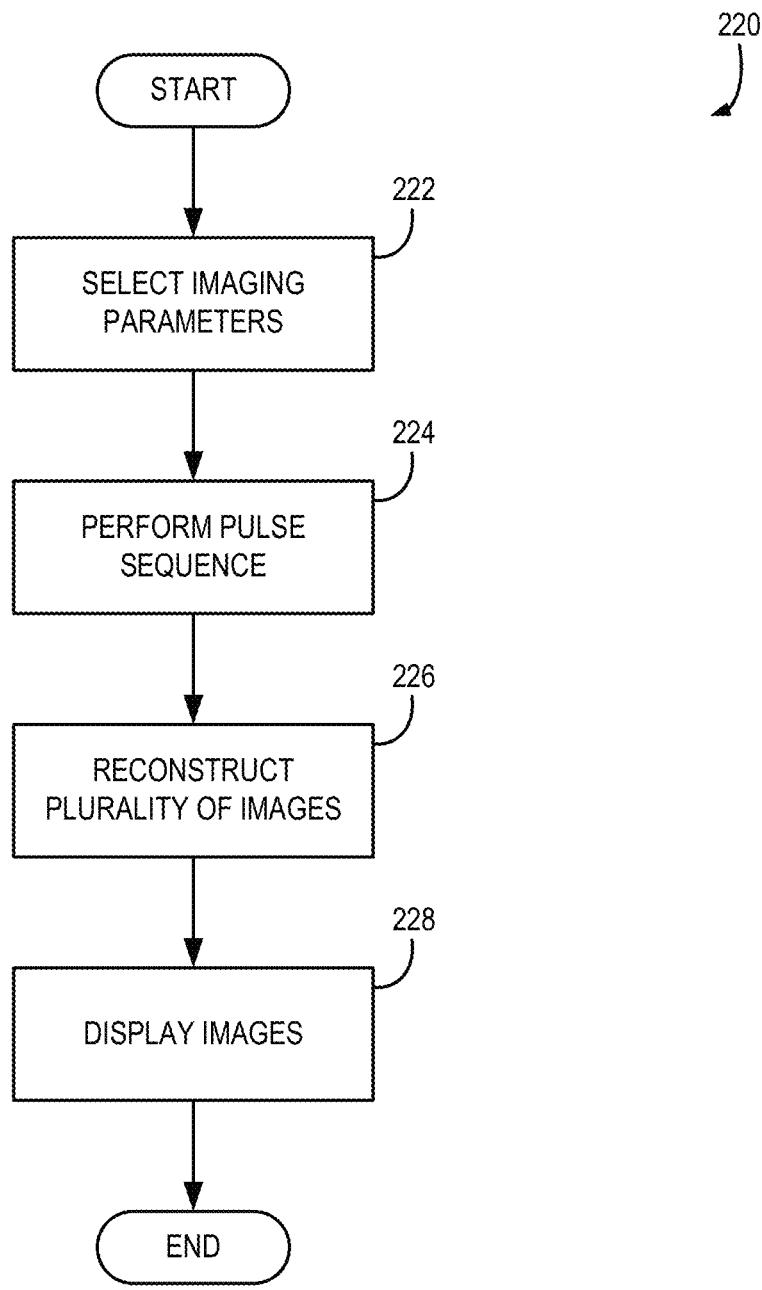
FIG. 2B is a flow chart setting forth steps of a process utilizing the system and pulse sequence of FIGS. 1 and 2 in accordance with the present disclosure.

Referring to FIG. 2B, a process 220 for using the STEM pulse sequence 200 begins by selecting imaging parameters at process block 222. That is, the STEM pulse sequence 200 provides a framework that presents variables of at least TM, TE, and b-values that can be selected, for example using the following optimization or parameterization framework, to collect data for a desired clinical application. For example, adjusting the duration of TE/2 can vary the T2 contrast. As another example, varying the duration (δ) of the diffusion encoding gradients 210 or the strength of diffusion encoding gradients 210 adjusts the diffusion weighting. Also, adjusting the TM varies the T1 contrast. Thus, the STEM pulse sequence 200 provides a framework that enables one to probe dynamic changes of contrast mechanisms (e.g., T1, T2, and diffusion) over time or via other imaging variables or imaging parameters of the STEM pulse sequence 200.

Thus, using the signal model of Eqns. 3 and 5 (or other signal models), the imaging parameters are selected at process block 222. As will be described, using these imaging parameters, the pulse sequence 200 can be performed at process block 224 to acquire MR image data with different TM, TE, and b-value combinations can be used to fit the signal model. In this example, T1 relaxation, T2 relaxation and ADC, as well as proton density weighted maps (A), can be jointly estimated by voxel-wise non-linear least-squares fitting of Eqn. 3.

As mentioned, a variety of signal models may also be used. For example, instead of ADC, a diffusion tensor imaging (DTI) model, diffusion spectrum imaging (DSI) model, a q-ball imaging (QBI) model, and others may also be used. Other models, including non-Gaussian diffusion, such as described in Lu H, Jensen, J H, Ramani A, Helpern J A. Three-dimensional characterization of non-Gaussian water diffusion in humans using diffusion kurtosis imaging. NMR Biomed 2006; 19(2):236-247, and multi-compartment models, such as described in Kim D, Doyle E K, Wisnowski J L, Kim J H, Haldar J P. Diffusion-relaxation correlation spectroscopic imaging: A multidimensional approach for probing microstructure. Magn Reson Med 2017. DOI: 10.1002/mrm.26629, Mulkern R V, Zengingonul H P, Robertson R L, et al. Multi-component apparent diffusion coefficients in human brain: relationship to spin-lattice relaxation. Magn Reson Med 2000; 44(2):292-300, and Le Bihan D, Breton E, Lallemand D, Aubin M L, Vignaud J, Laval-Jeantet M. Separation of diffusion and perfusion in intravoxel incoherent motion MR imaging. Radiology 1988; 168(2):497-505. (each of which is incorporated herein by reference in its entirety) may also be used with the STEM pulse sequence 200.

To use the above described STEM pulse sequence 200 for simultaneous acquisition of T1, T2, and ADC data, MR image data suitable for at least four total images is acquired at process block 224. That is, in order to estimate T1, T2, and ADC from the signal model in Eqn. 3, it suffices to acquire data using two different TM, TE, and b-values. Determining the TM, TE, and b-values can be formulated as an optimization function. This optimization function can be formulated as a minimax problem of the Cramér-Rao Lower Bound (CRLB)-based standard deviation of the resulting T1, T2, and ADC estimates. In general, an objective function can be chosen based on any of a variety of criteria. In one non-limiting example, the optimization problem can be formulated as:

$$\hat{\theta} = \operatorname*{argmin}_{\theta \in \Theta} \max\{\sigma^2 \mid_{(T1, T2, ADC) \in \Omega}\} = \qquad \text{Eqn. 5}$$
$$\operatorname*{argmin}_{\theta \in \Theta} \left\{ \left(\frac{\sigma T1}{T1}\right)^2 + \left(\frac{\sigma T2}{T2}\right)^2 + \left(\frac{\sigma AD2}{ADC}\right)^2 \mid_{(T1, T2, ADC) \in \Omega}\right\}$$

In this optimization problem, $\Omega$ is the given T1-T2-ADC space that defines the range of tissue parameters under consideration, and $\Theta$ is the constraint space determined by the scanner and pulse sequence properties. Additionally, $\hat{\theta}$ is a vector containing the optimized protocol parameters, which in this example are defined as TE1, TE2, TM1, TM2 and two b-values b1 and b2. These acquisition parameters determine the four acquired images with [TE1, TM1, b1], [TE2, TM1, b1] and [TE1, TM2, b1] and [TE1, TM1, b2], respectively. Further, σT1, σT2, and σADC are the standard deviation from CRLB analysis of the magnitude signal with a given SNR (Rician noise). The sum of squares of the relative standard deviations can be chosen as the cost function to ensure a balanced consideration of the noise performance of T1, T2, and ADC estimation.

The constraint space $\Theta$ can include constraints on the sequence timing and the achievable b-values. First, the two echo times should have a lower bound defined by the RF pulse durations $T_{90}^1$ and $T_{90}^2$ and EPI readout train length $T_{EPI}$:

$$TE \geq \max\left\{\frac{T_{90}^1 + T_{90}^2}{2}, \frac{T_{90}^2}{2} + T_{EPI}\right\}. \qquad \text{Eqn. 6}$$

Similarly, the two mixing times should be longer than the second and the third 90 degree pulse:

$$TM > T_{90}^2 \qquad \text{Eqn. 7.}$$

Second, the maximum achievable b-value with the given TE and TM should be larger than both b1 and b2, as follows:

$$b \leq (\gamma G_{max} \delta)^2 \left(\Delta - \frac{\delta}{3}\right); \qquad \text{Eqn. 8}$$

where $\gamma$ is the gyromagnetic ratio and $G_{max}$ is the maximum gradient strength of the scanner. $\Delta$ is the diffusion time and $\delta$ is the duration of diffusion encoding lobe, assuming infinite slew rate to simplify the description. With minimized TE, $\Delta$ and $\delta$ can be expressed in terms of the remaining pulse sequence timing parameters including TE, TM and RF pulse durations:

$$\delta = \min\left\{\frac{TE - T_{90}^2}{2} - T_{EPI}, \frac{TE - T_{90}^1 - T_{90}^2}{2}\right\}; \qquad \text{Eqn. 9}$$

$$\Delta = \delta + T_{90}^2 + TM. \qquad \text{Eqn. 10}$$

In one non-limiting example, sequence parameter constraints included $G_{max}$=50 mT/m, $T_{90}^1$=12 ms for water selective excitation pulse, $T_{90}^2$=6.5 ms and $T_{EPI}$=10 ms. SNR in this example, which was equal to the proton density weighted signal A divided by the standard deviation, was set as 50. Optimization was run with different T1-T2-ADC space 5 for healthy brain and healthy prostate tissues respectively, where T1 ∈ (700, 1350)ms, T2 ∈ (50, 150)ms and ADC ∈ (550, 1400)×$10^{-6}$ mm²/s for brain and T1 ∈ (600, 1500) ms, T2 ∈ (50, 100) ms and ADC ∈ (800, 1500)×$10^{-6}$ mm²/s for prostate.

With this optimization scenario, the optimal combinations of TE, TM, and b-values can be readily obtained at process block 222. Thereafter, the pulse sequence can be performed at process block 224. In the above non-limiting example, optimized rapid acquisitions were selected retrospectively by choosing the optimal combination of TE1, TE2, TM1, TM2, b1, b2 from the densely-sampled acquisitions described above for brain and prostate. At process block 226, a plurality of registered images are reconstructed, where the images a registered without error or manual or computer-aided dedicated registration processes because the image data for each image was simultaneously acquired or acquired during a common or single pulse sequence. In the non-limiting example provided above, the data from the resulting rapid acquisitions were re-fitted to the signal model (Eqn. 3), to obtain T1, T2, and ADC parametric maps. At process block 228, the images and/or maps that are reconstructed can then be displayed, in registered, overlapping, or other configurations.

Evaluation of B1 Inhomogeneity Effects

T1 mapping methods are often confounded by B1 inhomogeneity effects. To evaluate the effect of imperfect B1 fields on the quantitative STEM measurements, several STEM acquisitions with different actual flip angles were obtained by adjusting the scanner transmit gain. With this setup, the actual STE sequence performed included three α° pulses instead of the idealized three 90° pulses. A NiCl2-doped water phantom was scanned at 3T using an eight-channel head coil with default transmit gain. To adjust the actual flip angle, two additional acquisitions were obtained with transmit gains equal to 45% and 135% of the original transmit gain, respectively. The STEM pulse sequence was implemented with TM=[25, 100, 100]ms, TE=[50, 42, 80]ms and b-values(# average)=[0(2),100(2),200(2),400(4), 800(8)]s/mm2. Other parameters included TR=3 s, slice thickness=5 mm, FOV=26 cm, in-plane resolution=2 mm×2 mm and diffusion direction=R/L. Bloch-Siegert B1 maps were acquired to measure the actual flip angle in different regions within the acquired slice. Two ROIs (~1 cm2) were drawn from each actual flip angle map of the images acquired with different transmit gains (6 ROIs in total).

The corresponding STEM-based T1, T2 and ADC measurements co-localized with the previously described ROIs were used to analyze the relationship between the quantitative measurements and actual flip angle. Linear regression between each quantitative measurement and the actual flip angles was performed to evaluate the effects of B1 inhomogeneity on STEM measurements.

Dependence of T1, T2, and ADC Quantification on Acquisition Parameters

The above-described STEM pulse sequence, which samples the MR parameter space along multiple relaxometry and diffusion dimensions, allows for more sophisticated multi-parametric tissue characterization beyond the basic signal model described in Eqn. 3. For instance, Eqn. 3 jointly fits all the data without accounting for the potential dependence of T1/T2/ADC on the acquisition parameters. However, this dependence might occur in tissue, for example, due to the presence of partial volume effects or non-Gaussian diffusion. Therefore, the measured T1 or T2 may vary with increasing b-value, and the measured ADC may vary with increasing TE or TM (even for a constant set of b-values). To evaluate this dependence in both brain and prostate data, a separate estimation of each quantitative parameter was performed within four groups of acquisition parameters:

1) Fixed TE=40 ms, for each b-value, calculate T1 maps with TM=[100, 500, 800, 1000]ms (to evaluate the effect of b-value on measured T1);

2) Fixed TM=100 ms, for each b-value, calculate T2 maps with TE=[40, 50, 80]ms for the brain and TE=[40, 50, 65]ms for the prostate (to evaluate the effect of b-value on measured T2);

3) Fixed TE=40 ms, for each TM, calculate ADC maps with all six b-values (to evaluate the effect of TM on measured ADC);

4) Fixed TM=100 ms, for each TE, calculate ADC maps with all six b-values (to evaluate the effect of TE on measured ADC).

ROI measurements from regions of the brain and prostate scans were performed in the corresponding maps from each group of parameters, and displayed using boxplots. A linear mixed-effect (LME) fitting model was applied to evaluate the association between measurements and acquisition parameters.

Specifically, in this non-limiting example study, for brain imaging, healthy volunteers (n=8) were scanned at the 3T scanner with an eight-channel head coil for brain mapping. The STEM acquisitions and reference T1, T2 and ADC mapping sequences were performed in each volunteer with interleaved slices were acquired within a TR (detailed imaging protocol shown in Table 1).

TABLE 1

| | | |
|---|---|---|
| IR FSE (Reference T1 mapping) (8 min 48 s) | FOV = 28 cm × 28 cm, In-plane resolution = 1.1 mm × 1.75 mm Slice thickness = 5 mm, Average = 1, Bandwidth = ±15.63 kHz, TR = 6 s T1 = [50, 200, 350, 425, 500, 750, 900, 1100] ms | |
| Multi-TE SE (Reference T2 mapping) (10 min 10 s) | FOV = 28 cm × 28 cm, In-plane resolution = 2.2 mm × 2.2 mm Parallel imaging factor = 2, Slice thickness = 5 mm, Bandwidth = ±62.5 kHz, TR = 1.8 s TE = [30, 60, 90, 120, 150] ms | |
| STE-DWI (Reference ADC mapping) (1 min 40 s) | FOV = 28 cm × 28 cm, Resolution = 2.2 mm × 2.2 mm, Parallel imaging factor = 2, Slice thickness = 5 mm, Bandwidth = ±62.5 kHz, TR = 4 s, Diffusion direction = R/L, TM = 100 ms, TE = 40 ms, b == [50, 100, 200(2), 400(4), 600(6), 800(8)] s/mm² | |
| STEM (13 min 20 s) | TM = 25 ms, TE = 49 ms | FOV = 28 cm × |
| | TM = 100 ms, TE = 40 ms | 28 cm, Resolution = |
| | TM = 100 ms, TE = 50 ms | 2.2 mm × 2.2 mm |
| | TM = 100 ms, TE = 80 ms | Parallel imaging |
| | TM = 500 ms, TE = 40 ms | factor = 2, Slice |
| | TM = 500 ms, TE = 50 ms | thickness = 5 mm, |
| | TM = 500 ms, TE = 80 ms | Bandwidth = |
| | TM = 1000 ms, TE = 40 ms | ±62.5 kHz, TR = 4 s Diffusion direction = R/L, Same b-values as STE-DWI |

A single diffusion direction was used in this study to save acquisition time. Note that the ADC maps from a single STE-DWI acquisition (TE=40 ms, TM=100 ms) instead of spin-echo DWI were used as reference to match the diffusion time of the proposed method under restricted diffusion. Histograms of pixel-wise quantitative measurements covering the entire slice were plotted in two different slices. To measure T1, T2 and ADC, co-localized ROIs were drawn in the parietal right white matter within the corona radiata (WM, ~1 cm2), as well as in the parietal right gray matter (GM, 40 mm2) for statistical analysis. ROIs were drawn in the same region for all volunteers, and the averaged measurements as well as standard deviation across volunteers were calculated.

For prostate imaging, healthy volunteers (n=8) were scanned at the same 3T scanner with a 32-channel torso coil for prostate mapping. No antiperistaltic agents were used in this study. As shown in Table 2, the STEM acquisitions were performed with eight TE and TM combinations, each with six b-values and a single diffusion direction.

TABLE 2

| | |
|---|---|
| DESPOT1 with B1 correction (Reference T1 mapping) (4 min 36 s) | FOV = 28 cm×28×14 cm, In-plane resolution = 0.8 mm × 0.57 mm Slice thickness = 5 mm, Average = 4, Bandwidth = ±62.5 kHz, TR = 4 s Flip angle = [10°, 5°, |
| Multi-TE SE (Reference T2 mapping) (8 min 08 s) | FOV = 26 cm × 32 cm, In-plane resolution = 2.5 mm × 2.5 mm Parallel imaging factor = 2, Slice thickness = 5 mm, Bandwidth = ±62.5 kHz, TR = 1.8 s TE = [20, 60, 80, 120] ms |
| STE-DWI (Reference ADC mapping) (2 min 52 s) | FOV = 32 cm × 32 cm, Resolution = 2.5 mm × 2.5 mm, Parallel imaging factor = 2, Slice thickness = 5 mm, Bandwidth = ±62.5 kHz, TR = 4 s, Diffusion direction = R/L, TM = 100 ms, TE = 40 ms, b = [50, 100, 200(2), 400(4), 600(6), 800(8)] s/mm$^2$ |
| STEM (22 min 56 s) | TM = 25 ms, TE = 49 ms<br>TM = 100 ms, TE = 40 ms<br>TM = 100 ms, TE = 50 ms<br>TM = 100 ms, TE = 65 ms<br>TM = 500 ms, TE = 40 ms<br>TM = 500 ms, TE = 50 ms<br>TM = 500 ms, TE = 65 ms<br>TM = 1000 ms, TE = 40 ms | FOV = 32 cm × 32 cm, Resolution = 2.5 mm × 2.5 mm Parallel imaging factor = 2, Slice thickness = 5 mm, Bandwidth = ±62.5 kHz, TR = 4 s Diffusion direction = R/L |

Interleaved slices were acquired within a TR. Due to scan time limitations, DESPOT1 was performed as the reference T1 map. Also, similar to brain imaging, a single STE-DWI acquisition (TE=40 ms, TM=100 ms was used as reference because of restricted diffusion in the prostate. Histograms of pixel-wise quantitative T1, T2, and ADC measurements within the prostate were evaluated from a single slice covering the mid-gland of the prostate. Co-localized ROIs were drawn in the peripheral zone (PZ, 40 mm2) and central gland (CG, 40 mm2) for further quantitative evaluation of T1, T2, and ADC. ROIs were drawn in the same region for all volunteers, and the averaged measurements as well as standard deviation across volunteers were calculated.

Figure 3:
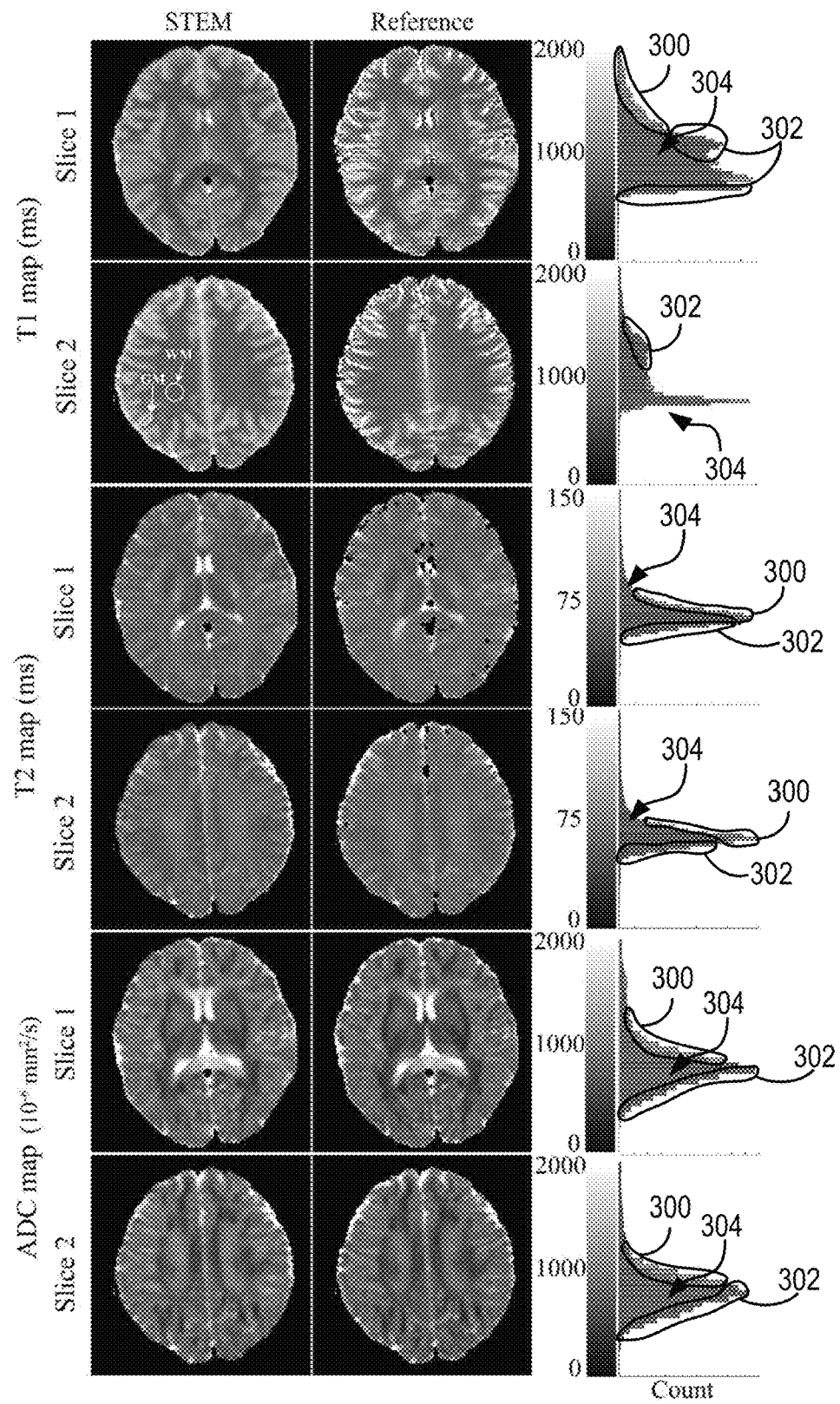
FIG. 3 is a set of images and correlates histograms showing distributions of T1, T2 and ADC measurements in the brain using the pulse sequence of FIG. 2 and a system such as illustrated in FIG. 1 compared to the standard/reference mapping methods.

Representative quantitative maps for two different slices in the brain of a healthy volunteer, with histograms from each entire slice are presented in FIG. 3. Bars 300 in the histograms are from the reference maps, while bars 302 are from the STEM maps and the areas 304 show the overlap between the STEM maps and reference maps. The high overlap between STEM and reference measurement histograms illustrates the accuracy of the present STEM techniques described above. Notably, the STE-DWI sequence used in the STEM pulse sequence may have limited spatial resolution compared to the reference IR-FSE T1 mapping and SE T2 mapping techniques.

Figure 4:
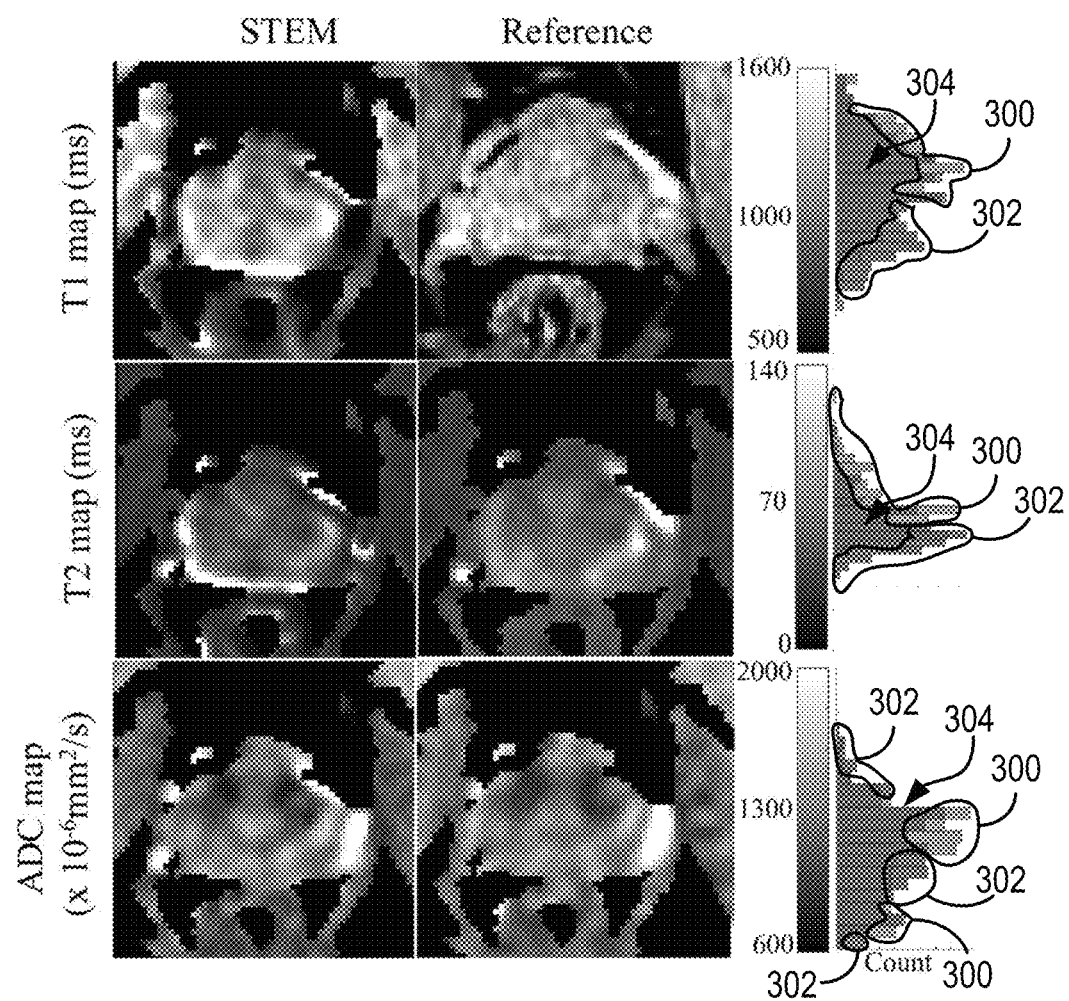
FIG. 4 is a set of images and correlates histograms showing distributions of T1, T2 and ADC measurements in the prostate using the pulse sequence of FIG. 2 and a system such as illustrated in FIG. 1 compared to the standard/reference mapping methods.

Regarding prostate imaging, FIG. 4 shows representative maps and histograms of the prostate. Although high overall agreement is observed between STEM maps and the reference mapping methods, some estimation bias and image artifacts may be present in STEM maps, especially near the edges of the prostate.

Table 3 summarizes the T1, T2, and ADC measurements in the brain and prostate across all subjects.

TABLE 3

| | White matter Rapid | | | Gray matter Rapid | | |
|---|---|---|---|---|---|---|
| Brain | STEM | STEM | Reference | STEM | STEM | Reference |
| T1 (ms) | 780.8 ± 47.5 | 805.8 ± 52.1 | 788.5 ± 49.3 | 1241.4 ± 119.1 | 1253.3 ± 106.6 | 1219.9 ± 92.3 |
| T2 (ms) | 65.6 ± 4.2 | 67.5 ± 4.9 | 67.1 ± 4.0 | 71.4 ± 6.4 | 77.5 ± 8.1 | 76.9 ± 6.2 |
| ADC (×10$^{-6}$ mm$^2$/s) | 690.7 ± 125.4 | 708.0 ± 120.9 | 710.0 ± 126.9 | 928.6 ± 103.8 | 918.5 ± 81.2 | 918.8 ± 86.4 |

| | Peripheral zone (PZ) Rapid | | | Central gland (CG) Rapid | | |
|---|---|---|---|---|---|---|
| Prostate | STEM | STEM | Reference | STEM | STEM | Reference |
| T1 (ms) | 1344.1 ± 63.5 | 1420.4 ± 217.2 | 1349.8 ± 149.2 | 1156.7 ± 65.6 | 1216.6 ± 113.5 | 1244.5 ± 104.3 |
| T2 (ms) | 65.1 ± 6.3 | 68.1 ± 10.3 | 70.6 ± 5.5 | 53.2 ± 6.7 | 58.1 ± 13.2 | 57.4 ± 4.6 |
| ADC (×10$^{-6}$ mm$^2$/s) | 1200.7 ± 102.4 | 1151.5 ± 141.4 | 1140.9 ± 132.2 | 1038.0 ± 88.8 | 1040.2 ± 136.4 | 1038.1 ± 97.2 |

Overall, STEM measurements are in excellent agreement with reference measurements, with similar standard deviation across subjects Clinical Protocol Optimization for Rapid Stem Acquisitions In the protocol optimization simulations, the optimized acquisition parameters for rapid STEM imaging were TE1=39.4 ms, TE2=92.2 ms, TM1=123.1 ms, TM2=1026.2 ms and b1=0 s/mm2 and b2=826.5 s/mm2 in the brain and TE1=39.6 ms, TE2=95.0 ms, TM1=124.2 ms, TM2=1244.5 ms and b1=0 s/mm2 and b2=863.9 s/mm2 in the prostate. Among the parameters acquired in the previously-obtained, densely-sampled, in-vivo datasets, the optimal combinations were TE1=40 ms, TE2=80 ms, TM1=100 ms, TM2=1000 ms and b1=50 s/mm2 and b2=800 s/mm2 in the brain and TE1=40 ms, TE2=65 ms, TM1=100 ms, TM2=1000 ms and b1=50 s/mm2 and b2=800 s/mm2 in the prostate. The optimized rapid STEM acquisitions were less than 2 minutes for both brain and prostate imaging.

Figure 5A:
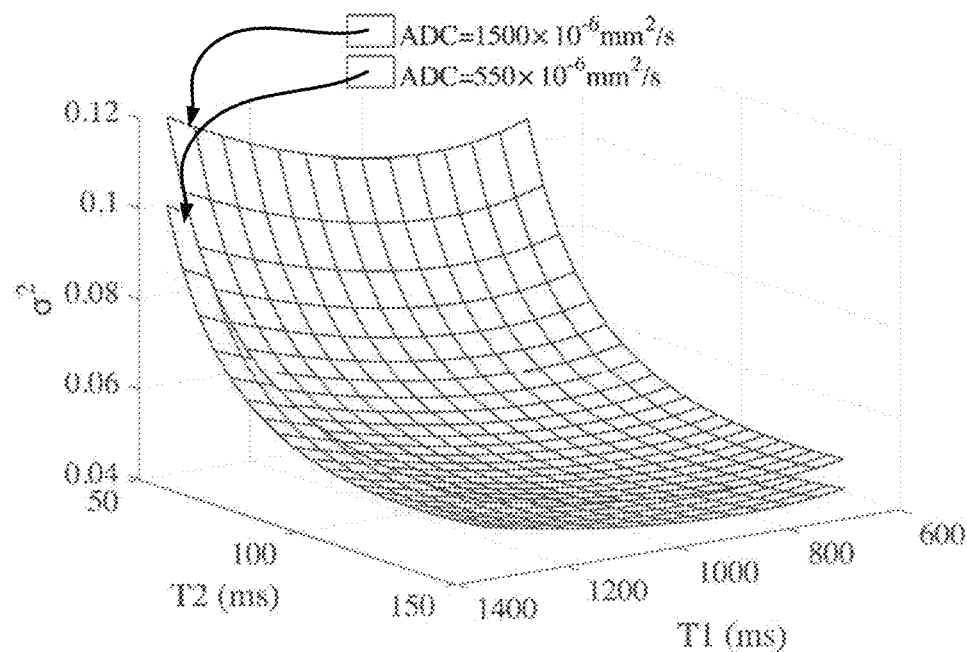
FIG. 5A is a graph showing one example of a cost function used for optimization of rapid acquisition protocols for healthy brain.
Figure 5B:
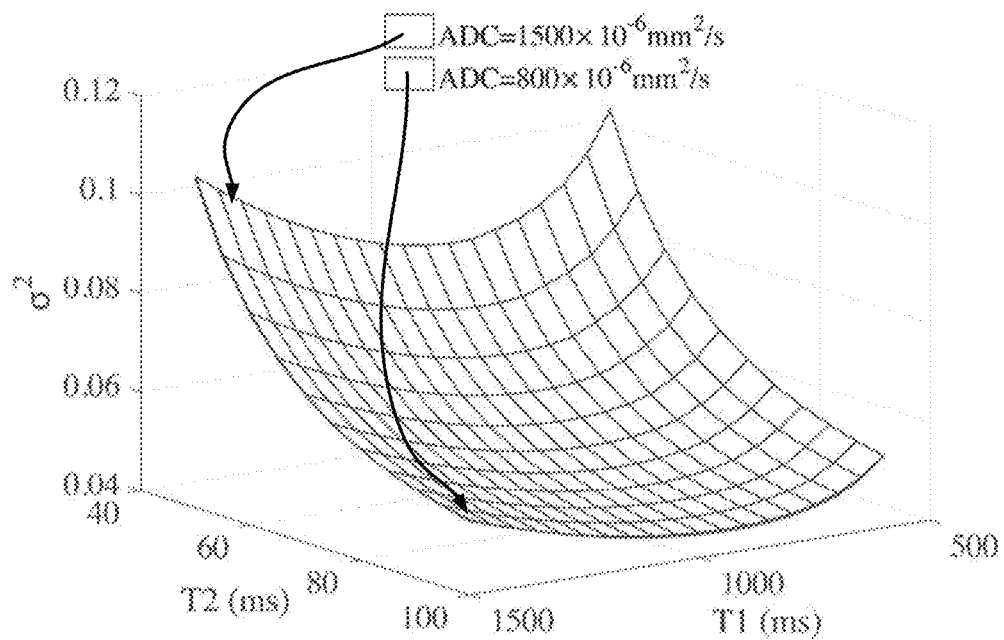
FIG. 5B is a graph showing one example of a cost function used for optimization of rapid acquisition protocols for healthy prostate.

As illustrated in FIGS. 5A and 5B, example plots of the cost function $\sigma^2$ (i.e., the sum-of-squares of relative standard deviation for T1-T2-ADC estimation, as a function of the acquisition parameters) used for optimization of rapid acquisition protocols. In addition, FIGS. 5A and 5B show the T1, T2 and ADC maps estimated from the resulting optimized rapid protocol, where FIG. 5A illustrates data from the brain and FIG. 5B was created from prostate data. Quantitative maps from the rapid STEM acquisition are noisier than the original densely-sampled maps; however, the measurements remain accurate. ROI measurements from the rapid STEM acquisitions in brain and prostate are also summarized in Table 3.

Evaluation of B1 Imperfection

In one case study, the flip angles measured over six ROIs in three acquisitions were 49.1°, 62.9°, 100.8°, 132.4°, 138.4°, and 157.6°. Based on linear regression analysis, the coefficients (slopes) between T1 and flip angle, T2 and flip angle and ADC and flip angle were $-1.23 \times 10^{-2}$ (P=0.210), $3.90 \times 10^{-3}$ (P=0.645), and $1.36 \times 10^{-1}$ (P=0.181), respectively. With a 95% confidence level, quantitative T1, T2, and ADC measurements from STEM acquisitions were not affected by imperfect flip angle.

Dependence of T1, T2, and ADC Quantification on Acquisition Parameters

Plots from ROI measurements in the quantitative measurements for varying acquisition parameters were taken. The LME analysis results, including the slope and P-values, were analyzed. Though the number of volunteers was limited, some measurements were significantly dependent on acquisition parameters. For example, the measured T2 values showed a significant decrease with increasing b-values for gray matter as well as for the prostate PZ and CG (P<0.001).

Discussion

The STEM pulse sequence allows for simultaneous quantitative T1, T2, and ADC mapping. That is, the STEM pulse sequence is a single pulse sequence that can be used to acquire quantitative T1, T2, and ADC data suitable to produce respective maps. Multiple studies have shown the overall T1, T2, and ADC measurements created using data acquired using the STEM pulse sequence to be accurate in phantom experiments, as well as in vivo brain and prostate studies. Further, protocol optimization was performed to achieve accurate STEM quantification within 2 minutes. The STEM pulse sequence allows for rapid and co-registered multiparametric imaging, with clinical applications in the brain, prostate, and breast, among many others.

In brain mapping, the estimated T1 and T2 with densely-sampled STEM and rapid STEM acquisitions were demonstrated to be agreement with measurements from previous studies. The T1 histograms create using the STEM pulse sequence showed two peaks, representing white matter and gray matter, respectively. This is in good agreement with previous T1 mapping studies performed with moderate spatial resolution.

As described, a simple or complex signal model may be used for jointly estimating T1, T2 and ADC values. In the presence of restricted diffusion, ADC will generally depend on the acquisition parameters, including choice of b-values and diffusion time. Therefore, more sophisticated diffusion models may be preferable under some circumstances. Also, partial volume effects may arise when multiple tissue components, epithelial and stromal components in the prostate for example, are contained in a voxel. These tissue components generally have different T1, T2, and diffusion properties, which may explain in part the slight underestimation in the in-vivo T2 measurements of both brain and prostate compared to the reference SE T2 mapping. These confounding factors, which present a challenge for naïve signal modeling approaches, can be addressed using advanced, multi-compartment tissue characterization by exploiting the multiple signal dimensions (T1, T2, diffusion) probed by the STEM pulse sequence.

In this work, scan times using the STEM pulse sequence ranged from 1 minute and 13 seconds with rapid acquisition to 22 minutes and 56 seconds with dense sampling of the TM-TE-b space. The acquisition time depends on multiple parameters, including the number of b-values and diffusion directions, and the choice of TM and TE combinations. In principle, a minimum of four images with different TM, TE and b-values are desirable when performing the STEM pulse sequence. With protocol optimization, the maximum acquired TM and TE should be of the same order as the tissue T1 and T2, respectively. When T1 is very long (over 1000 ms, as is the case in the prostate), a long TM (e.g., 800-1200 ms) is desirable to create enough T1 decay. However, this will result in longer acquisitions with substantial 'dead time' during the mixing time.

The STEM pulse sequence and techniques described herein are accurate quantitative mapping. Each individually-acquired STEM image is highly robust to motion due to the single-shot EPI readout. In clinical prostate imaging applications, antiperistaltic agents may be used to reduce small bowel motility, which may significantly reduce the artifacts in prostate measurements. For other organs, registration-based approaches may mitigate motion-related artifacts. Additional models beyond ADC may be utilized with the systems and methods described herein, in order to account for the presence of restricted diffusion.

Thus, the present disclosure provides system and methods for a stimulated-echo based approach, termed STEM, for simultaneous multi-parametric relaxometry and diffusion mapping. This method provides accurate quantitative maps of T1, T2, and ADC in a wide variety of clinical applications and has been demonstrated as effective in phantoms brain, and prostate imaging studies. An advanced multi-compartment tissue characterization in multiple parametric dimensions can be achieved using the systems and methods described herein.

The present invention has been described in terms of one or more preferred embodiments, and it should be appreciated that many equivalents, alternatives, variations, and modifications, aside from those expressly stated, are possible and within the scope of the invention.

The invention claimed is:

1. A magnetic resonance imaging (MRI) system comprising:
a magnet system configured to generate a polarizing magnetic field about at least a portion of a subject arranged in the MRI system;
a plurality of gradient coils configured to apply a gradient field to the polarizing magnetic field;
a radio frequency (RF) system configured to apply an excitation field to the subject and acquire MR image data from the subject;
a computer system programmed to generate a plurality of differently-weighted images of a subject by:
selecting imaging parameters for a pulse sequence that includes a diffusion weighted module and an anatomical imaging module, wherein the imaging parameters include at least a repetition time (TR), a mixing time (TM), an echo time (TE), and a diffusion weighting b-value, wherein the imaging parameters include at least two different values of at least TM, TE, and diffusing weighting b-value;
controlling the plurality of gradient coils and RF system to perform the pulse sequence using the imaging parameters to acquire the MR image data from the subject, wherein the at least two different values of at least TM, TE, and diffusing weighting b-value are used to acquire the MR image data;
reconstructing, from the MR image data, a plurality of images of the subject, including at least a T1-weighted image, a T2-weighted image, and a diffusion-weighted image; and
a display configured to display the T1-weighted image, the T2-weighted image, and the diffusion-weighted image.

2. The MRI system of claim 1, wherein the computer system is configured to select the imaging parameters by selecting the at least two different TE to acquire the MR image data with varied T2 decay times, selecting at least two different durations of diffusion gradients ($\delta$) or two different gradient strengths in the diffusion weighted module to acquire the MR image data with varied diffusion weighting b-values, and selecting the at least two different TM to acquire the MR image data with varied T1 decay times.

3. The MRI system of claim 1, wherein the computer system is configured to reconstruct the MR image data using a signal model to derive estimates of T1, T2, and apparent diffusion coefficient (ADC) from the MR image data.

4. The MRI system of claim 3, wherein the computer system is configured to estimate T1, T2, and ADC values by performing a voxel-wise non-linear least-squares fitting to the signal model.

5. The MRI system of claim 3, wherein the computer system is configured to utilize the signal model to include:

$$S = A\left(1 - e^{-\frac{TR_{eff}}{T1}}\right)e^{(-\frac{TM}{T1})}e^{(-\frac{TE}{T2})}e^{(-bADC)},$$

where: $TR_{eff} = TR - TM - \frac{TE}{2}$.

6. The MRI system of claim 3, wherein the computer system is configured to determine proton density weighted maps (A) from the MR image data.

7. The MRI system of claim 1, wherein the computer system is configured to select the at least two different values of at least TM, TE, and diffusing weighting b-value by performing an optimization process.

8. The MRI system of claim 1, wherein the computer system is configured to perform the optimization function to solve a minimax problem of a Cramer-Rao Lower Bound (CRLB)-based standard deviation of T1, T2, and ADC estimates.

9. The MRI system of claim 1, wherein the display is configured to display the T1-weighted image, the T2-weighted image, and the diffusion-weighted image in a registered orientation.

10. The MRI system of claim 1, wherein the plurality of images of the subject reconstructed by the computer system includes at least one of a map or an anatomical image of the subject and the T1-weighted image, the T2-weighted image, and the diffusion-weighted image displayed by the display includes at least one of a T1 map, a T2 map, a diffusion map or an anatomical image of the subject having at least one of a T1-weighting, a T2-weighting, or a diffusion weighting.

11. A method for acquiring a plurality of differently-weighted images of a subject using a single pulse sequence, the method comprising:
determining imaging parameters for a pulse sequence that includes a diffusion weighted module and an anatomical imaging module, wherein the imaging parameters include at least a repetition time (TR), a mixing time (TM), an echo time (TE), and a diffusion weighting b-value, wherein the imaging parameters include at least two different values of at least TM, TE, and diffusing weighting b-value;
using a magnetic resonance imaging system, performing a pulse sequence using the imaging parameters to acquire MR image data from a subject, wherein the at least two different values of at least TM, TE, and diffusing weighting b-value are used to acquire the MR image data; and
reconstructing, from the MR image data, a plurality of images of the subject, including at least a T1-weighted image, a T2-weighted image, and a diffusion-weighted image.

12. The method of claim 11, wherein determining the imaging parameters includes selecting the at least two different TE to acquire the MR image data with varied T2 decay times, selecting at least two different durations of diffusion gradients ($\delta$) or two different gradient strengths in the diffusion weighted module to acquire the MR image data with varied diffusion weighting b-values, and selecting the at least two different TM to acquire the MR image data with varied T1 decay times.

13. The method of claim 11, wherein reconstructing the MR image data includes using a signal model to derive estimates of T1, T2, and apparent diffusion coefficient (ADC) from the MR image data.

14. The method of claim 13, wherein reconstructing the MR image data includes performing a voxel-wise non-linear least-squares fitting to the signal model to estimate of T1, T2, and ADC.

15. The method of claim 13, wherein the signal model includes:

$$S = A\left(1 - e^{-\frac{Tr_{eff}}{T1}}\right)e^{(-\frac{TM}{T1})}e^{(-\frac{TE}{T2})}e^{(-bADC)},$$

where: $TR_{eff} = TR - TM - \frac{TE}{2}$.

16. The method of claim 13, wherein reconstructing includes determining proton density weighted maps (A) from the MR image data.

17. The method of claim 11, wherein determining imaging parameters includes selecting the at least two different values of at least TM, TE, and diffusing weighting b-value by performing an optimization process.

18. The method of claim 11, wherein the optimization process includes solving a minimax problem of a Cramer-Rao Lower Bound (CRLB)-based standard deviation of T1, T2, and ADC estimates.

19. The method of claim 11, wherein the plurality of images of the subject includes at least one of a T1 map, a T2 map, and a diffusion map or an anatomical image of the subject having at least one of a T1-weighting, a T2-weighting, or a diffusion weighting.

* * * * *

UNITED STATES PATENT AND TRADEMARK OFFICE
CERTIFICATE OF CORRECTION

PATENT NO. : 10,712,412 B2
APPLICATION NO. : 15/960235
DATED : July 14, 2020
INVENTOR(S) : Diego Hernando et al.

Page 1 of 1

It is certified that error appears in the above-identified patent and that said Letters Patent is hereby corrected as shown below:

In the Specification

Column 7, Line 21, "(8)" should be --($\delta$)--.

Signed and Sealed this
Sixth Day of October, 2020

Andrei Iancu
*Director of the United States Patent and Trademark Office*